United States Patent
Xu et al.

(10) Patent No.: US 10,574,223 B1
(45) Date of Patent: Feb. 25, 2020

(54) PARALLELED POWER SEMICONDUCTORS WITH CHOKES IN GATE PATH

(71) Applicant: Ford Global Technologies, LLC, Dearborn, MI (US)

(72) Inventors: Fan Xu, Novi, MI (US); Lihua Chen, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/355,412

(22) Filed: Mar. 15, 2019

(51) Int. Cl.
| H03K 17/16 | (2006.01) |
| H03K 3/01 | (2006.01) |
| H01F 17/04 | (2006.01) |
| H02P 1/00 | (2006.01) |
| H03K 17/0424 | (2006.01) |
| H05K 1/02 | (2006.01) |
| H05K 1/18 | (2006.01) |
| H05K 1/16 | (2006.01) |
| H03K 17/082 | (2006.01) |
| H03K 17/042 | (2006.01) |

(52) U.S. Cl.
CPC ... *H03K 17/0424* (2013.01); *H03K 17/04206* (2013.01); *H03K 17/0822* (2013.01); *H03K 17/0828* (2013.01); *H05K 1/0243* (2013.01); *H05K 1/165* (2013.01); *H05K 1/181* (2013.01); *H03K 2217/0027* (2013.01); *H05K 2201/1003* (2013.01); *H05K 2201/10151* (2013.01); *H05K 2201/10166* (2013.01); *H05K 2201/10522* (2013.01)

(58) Field of Classification Search
CPC .......... H03K 17/0424; H03K 17/0822; H03K 17/0828; H03K 17/04206; H03K 2217/0027; H05K 1/165; H05K 1/181; H05K 1/0243; H05K 2201/10151; H05K 2201/10166; H05K 2201/10522; H05K 2201/1003
See application file for complete search history.

(56) References Cited

U.S. PATENT DOCUMENTS

| 8,847,656 B1 | 9/2014 | A et al. |
| 10,210,982 B1 * | 2/2019 | Xu ........................ H01F 17/04 |
| 10,389,352 B1 * | 8/2019 | Xu ........................ H03K 17/168 |
| 2007/0152730 A1 | 7/2007 | Wagoner et al. |
| 2018/0123579 A1 | 5/2018 | Fink et al. |

* cited by examiner

*Primary Examiner* — Kenneth B Wells
(74) *Attorney, Agent, or Firm* — David B. Kelley; Brooks Kushman P.C.

(57) ABSTRACT

Power electronics circuitry has a pair of parallel power semiconductors each including a gate and a current sensor, a first differential mode choke defining a portion of a gate path connecting the gates, a second differential mode choke defining a portion of a sensor path connecting the current sensors, and a gate driver tapping the gate and current sensor paths.

20 Claims, 5 Drawing Sheets

PARALLELED POWER SEMICONDUCTORS WITH CHOKES IN GATE PATH

TECHNICAL FIELD

This disclosure relates to power semiconductor devices.

BACKGROUND

Power semiconductors are used as switches or rectifiers in certain power electronics, such as switch-mode power supplies. They are also called power devices or, when used in integrated circuits, power integrated circuits (ICs). A power semiconductor is usually used in commutation mode (it is either on or off), and has a design optimized for such usage. Power semiconductors are found in systems delivering tens of milliwatts (e.g., a headphone amplifier) and in systems delivering a gigawatt (e.g., a high voltage direct current transmission line).

Certain metal-oxide-semiconductor field-effect transistors (MOSFETs), a type of power semiconductor, are depletion channel devices: Voltage, not current, may be necessary to create a conduction path from drain to source. At low frequencies, this can reduce gate current because it is only required to charge gate capacitance during switching. Switching times range from tens of nanoseconds to a few hundred microseconds. Typically, MOSFET devices are not bi-directional and are not reverse voltage blocking.

An insulated-gate bipolar transistor (IGBT), another type of power semiconductor, often has characteristics common to bipolar junction transistors (BJTs) and MOSFETs. It may have a high gate impedance and thus low gate current requirements like a MOSFET. It may also have a low on state voltage drop in the operating mode like a BJT. Certain IGBTs can be used to block both positive and negative voltages, and have reduced input capacitance compared to MOSFET devices.

SUMMARY

Power electronics circuitry has a pair of parallel power semiconductors including gates connected via a gate path and current sensors connected via a sensor path, a gate driver tapping the gate and sensor paths, a first differential mode choke including a pair of windings defining a portion of the gate path and sharing a positive terminal with the gate driver, and a second differential mode choke including a pair of windings defining a portion of the sensor path and sharing a negative terminal with the gate driver.

Power electronics circuitry has a pair of parallel power semiconductors each including a gate and a current sensor, a first differential mode choke defining a portion of a gate path connecting the gates, a second differential mode choke defining a portion of a sensor path connecting the current sensors, and a gate driver tapping the gate and current sensor paths.

Power electronics circuitry has parallel power semiconductors associated with a printed circuit board. Each of the parallel power semiconductors includes a gate and a current sensor. The circuitry also has a first differential mode choke including a first magnetic core and a first pair of traces in different layers of the printed circuit board surrounding the first magnetic core and defining windings of the first differential mode choke. The first differential mode choke is in a gate path connecting the gates. The circuitry further has a second differential mode choke including a second magnetic core and a second pair of traces in different layers of the printed circuit board surrounding the second magnetic core and defining windings of the second differential mode choke. The second differential mode choke is in a sensor path connecting the current sensors. The circuitry still further has a gate driver including a positive terminal tapping the gate path and a negative terminal tapping the sensor path.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
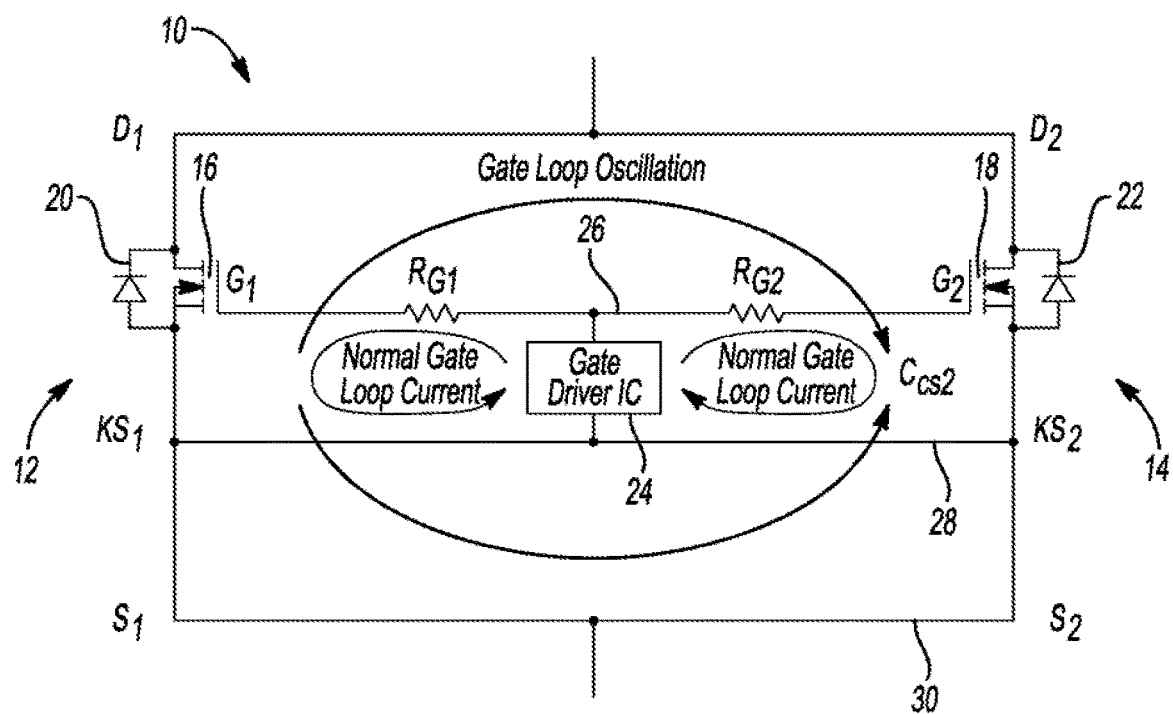
FIG. 1 is a circuit diagram of paralleled power semiconductors.

For high power applications such as traction inverters in electric vehicles, power semiconductors are generally used in parallel to achieve higher power capability. FIG. 1 shows a circuit 10 of paralleled power switching elements 12, 14. The switching elements 12, 14 respectively include active power semiconductors 16, 18 (e.g., IGBTs, MOSFETs, etc.) with or without anti-parallel power diodes 20, 22. The power switching elements 12, 14 have two power terminals, drains $D_1$, $D_2$ and sources $S_1$, $S_2$, and two control terminals, gates $G_1$, $G_2$, and Kelvin sources, $KS_1$, $KS_2$. (Within the context of IGBT technology, the power terminals would instead be collectors and emitters, and the control terminals would include Kelvin emitters rather than Kelvin sources.) The respective gates $G_1$, $G_2$, and Kelvin sources, $KS_1$, $KS_2$ comprise respective gate loops to control the power switching elements 12, 14. The circuit 10 also includes a gate driver integrated circuit 24 common to the gate loops, resistor $R_{G1}$ electrically between the gate $G_1$ and the gate driver integrated circuit 24, and resistor $R_{G2}$ electrically between the gate $G_2$ and the gate driver integrated circuit 24. Additionally, a gate path 26 electrically connects that gates $G_1$, $G_2$, a Kelvin path 28 electrically connects the Kelvin sources, $KS_1$, $KS_2$, and a source path 30 electrically connects the sources $S_1$, $S_2$.

Figure 2:
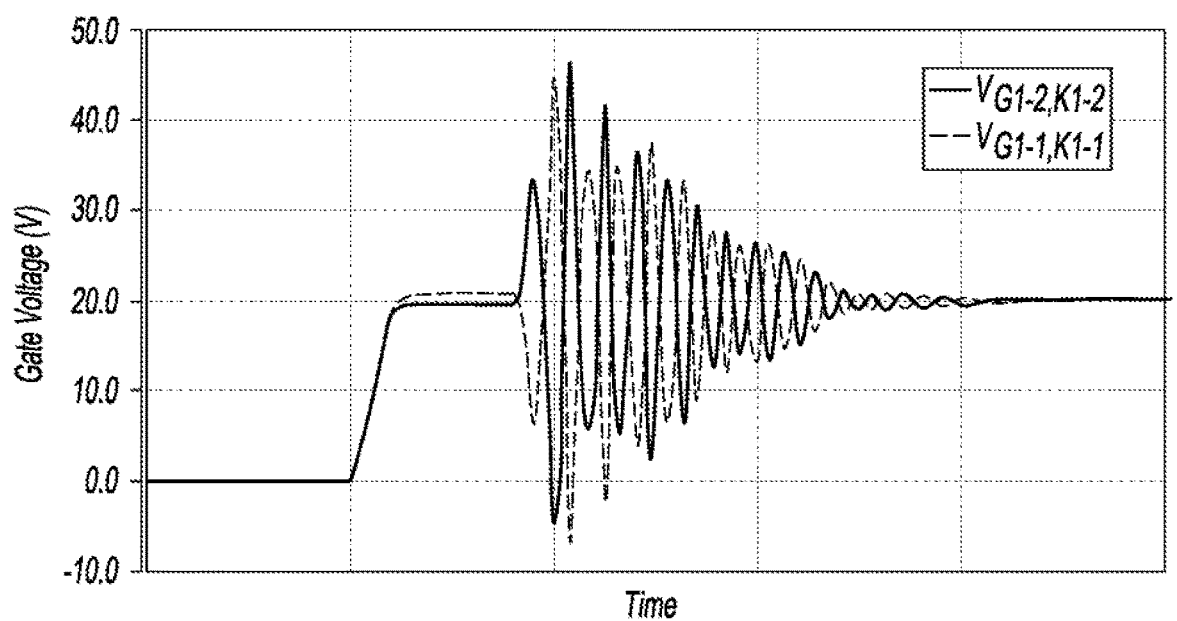
FIG. 2 is a plot of gate voltage oscillations associated with the circuit diagram of FIG. 1.

During power semiconductor switching transients, the switching ON/OFF transient currents of the power semiconductors 12, 14 are usually unbalanced, due to the piece-to-piece variation of the associated parameters, non-uniform busbar layout, and/or unbalanced junction capacitances and circuit stray inductances. These unbalanced currents may cause a potential difference on the emitter/source side ($V_{KS1}-V_{KS2}\neq 0$, $V_{S1}-V_{S2}\neq 0$). Ideally, the voltage difference should be kept at zero. The voltage difference ($V_{KS1}-V_{KS2}$), semiconductor junction capacitance, and circuit stray inductance initiates oscillation in the gate loops. The oscillation is uncontrollable and may result in oscillating gate voltage on the power semiconductors 12, 14 ($V_{G1}-V_{KS1}$, $V_{G2}-V_{KS2}$) with high amplitude. FIG. 2 shows the oscillation gate voltage waveforms from simulation. Voltages exceeding the rated gate voltages may be problematic. Moreover, paralleled silicon carbide MOSFETs, which switch much faster than silicon MOSFETs, are prone to gate voltage oscillation.

Some power semiconductors have an on-chip current sensor, which is a semiconductor cell. Current flowing through the current sensor cell is 1/n of the current flowing through the main semiconductor cells n. The current sensed by the sensor cell is used to measure the main power current and is fed back to the low power control circuit for applications, such as over current protection. In each power semiconductor chip, the current sensor cell gate G and drain D terminals are connected to main cells, but its terminal SS is separated from the main cell Kelvin terminal KS.

Figure 3:
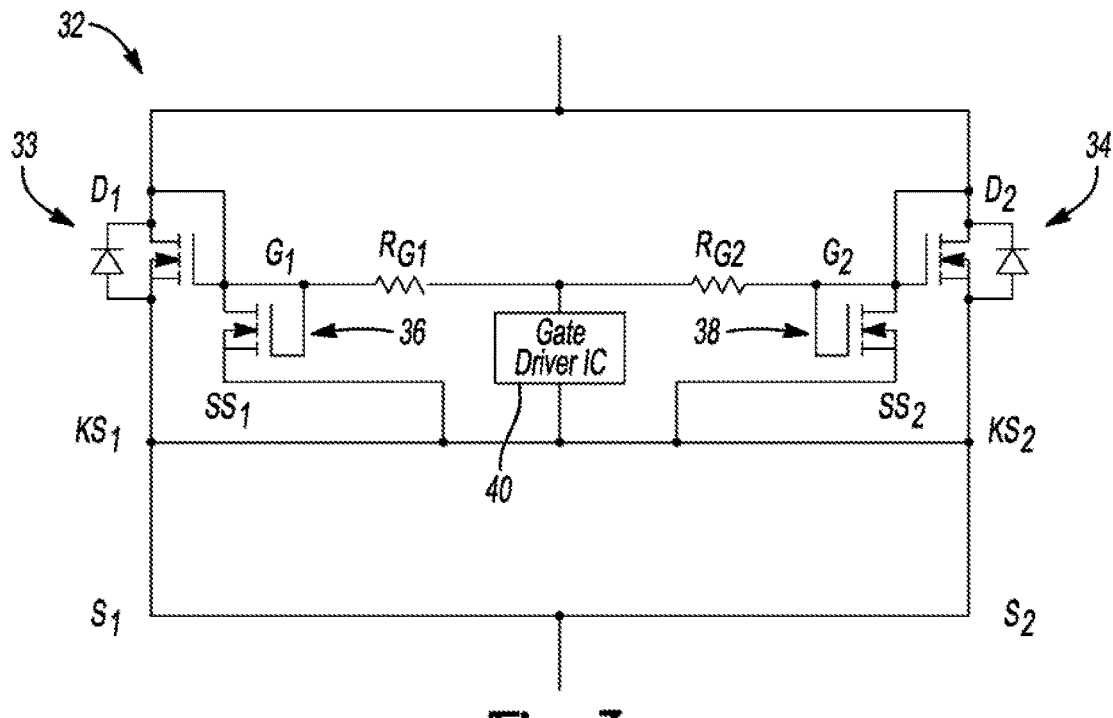
FIG. 3 is a circuit diagram of two paralleled power devices with on-chip current sensor cells.

FIG. 3 shows a circuit 32 of paralleled power semiconductors 33, 34 with on-chip current sensors 36, 38 (e.g., IGBTs, MOSFETs), and a gate driver integrated circuit 40. The current sensors 36, 38 share common drain terminals, gate terminals, and Kelvin sources with the power semiconductors 32, 34 respectively. That is, the power semiconductor 33 and current sensor 36 share drain terminal $D_1$, gate terminal $G_1$, and Kelvin source $KS_1$. And, the power semiconductor 34 and current sensor 38 share the drain terminal $D_2$, gate terminal $G_2$, and Kelvin source $KS_2$. The potential difference of $KS_1$ and $KS_2$, described above, will also cause current sensor gate voltage $V_{G1-SS1}$, $V_{G2-SS2}$ oscillations. Because the current sensors 36, 38 have smaller junction capacitances, they may experience issues before the power semiconductors 33, 34 experience issues.

To eliminate or reduce the gate voltage oscillation of paralleled power semiconductors, the gate path impedance should be large enough to damp the oscillation current. However, the larger impedance in the gate path slows down the power device switching speed and increases switching loss. Here, differential mode (DM) chokes in both the gate path and current sensor path are proposed to avoid gate oscillation and potential breakdown of both main cells and current sensor cells of power devices.

Figure 4:
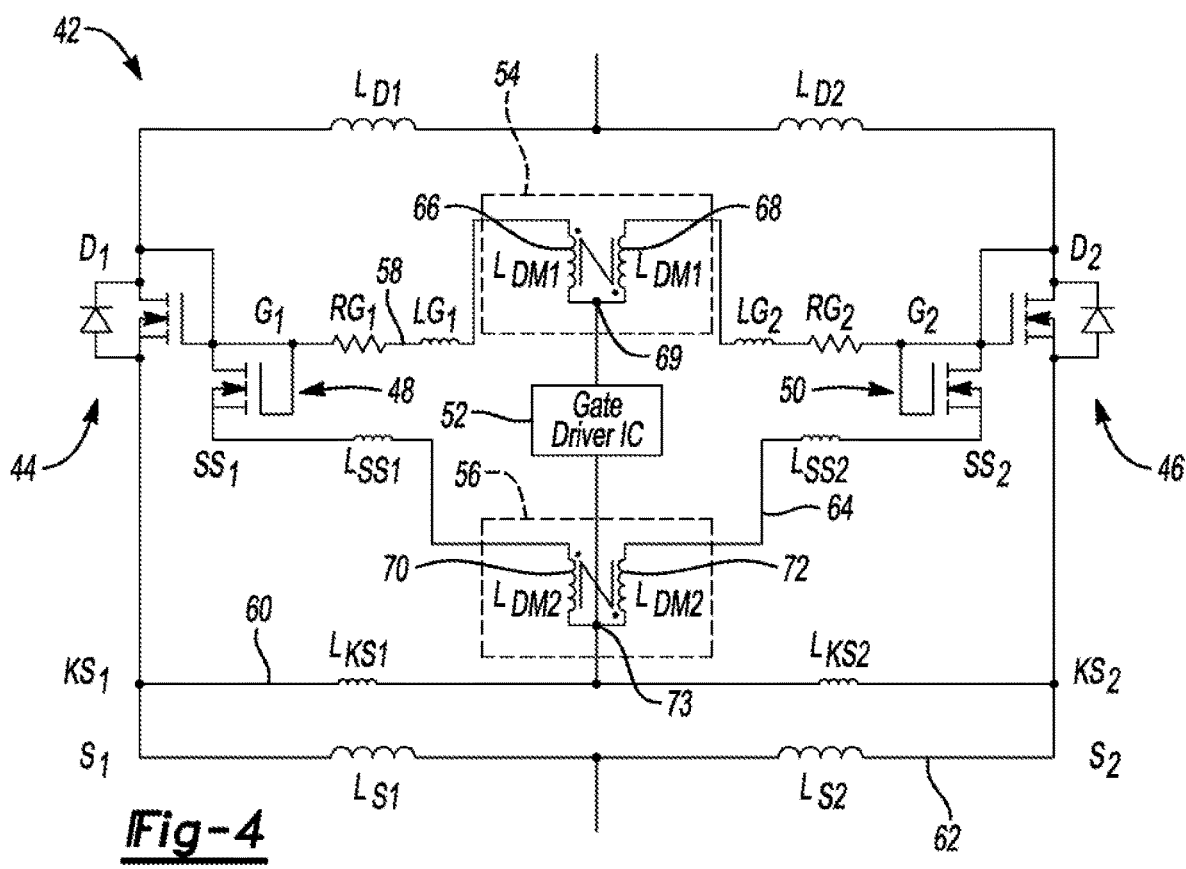
FIG. 4 is a circuit diagram of proposed chokes in two paralleled power devices.

FIG. 4 shows a proposed circuit 42 for paralleled power semiconductors 44, 46 with on-chip current sensors 48, 50, a gate driver integrated circuit 52, and DM chokes 54, 56. A gate path 58 electrically connects the gates $G_1$, $G_2$, a Kelvin path 60 connects the Kelvin sources $KS_1$, $KS_2$, a source path 62 connects the sources $S_1$, $S_2$, and a sensor path 64 connects the sensors 48, 50. The DM choke 54 is in the gate path 58 and includes windings 66, 68 that share a positive terminal 69 of the gate driver integrated circuit 52. Similarly, the DM choke 56 is in the sensor path 64 and includes windings 70, 72 that share a negative terminal 73 of the gate driver integrated circuit 52. The negative terminal 73 also taps the Kelvin path 60. If there is no gate path oscillating current during switching transients in the gate path 58, the equivalent impedance of the windings 66, 68 is zero because the gate currents in the gate paths are equivalent and in the opposite direction, and the fluxes in the windings 66, 68 cancel each other. Meanwhile, for oscillating current flowing from one power device to another through their gate paths, each winding will have the equivalent impedance of magnetizing inductance $L_{DM1}$. For the two paralleled power devices 44, 46, the oscillation current path (the gate path 58) will have the equivalent impedance of $2 \times L_{DM1}$.

Similarly, the impedance $L_{DM2}$ of the windings 70, 72 should be much larger than the equivalent impedance of the power device main cell and sensor cell junction capacitance. Thus, most of the potential difference ($V_{KS1}-V_{KS2}$) with high amplitude and oscillation will drop on $L_{DM2}$ instead of either the main cell or sensor cell gate, to prevent them from experiencing degradation.

FIG. 4 shows the two paralleled power devices 44, 46. The arrangements contemplated herein, however, can be extended to applications with N power devices in parallel (N>2). In that case, chokes should be used in the gate and sensor paths for every corresponding two devices, which means there will be N–1 chokes in the gate paths and N–1 chokes in the sensor paths. Moreover, several implementations of the schematic arrangement of FIG. 4 are proposed below. Only the chokes for two paralleled devices are shown, but all the implementations as well as the others contemplated herein can also be applied to N paralleled power device systems.

Figure 5:
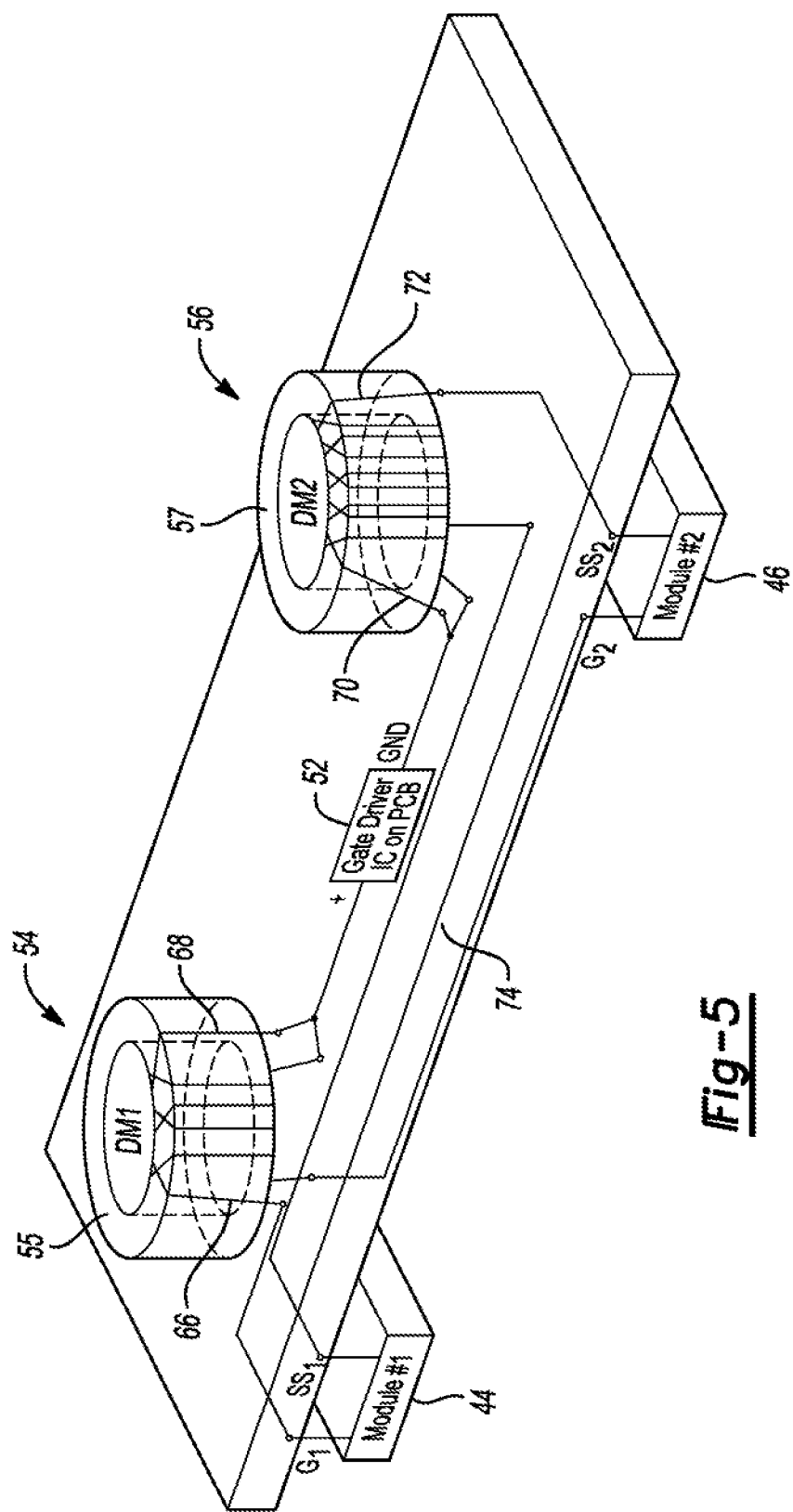
FIG. 5 is schematic diagram of differential mode (DM) chokes mounted/soldered on a gate drive PCB.

Referring to FIG. 5, the DM chokes 54, 56 include magnetic cores 55, 57 respectively. If wires are used to implement the windings 66, 68, 70, 72, they can be mounted/soldered directly on a printed circuit board (PCB) 74 of the gate driver integrated circuit 52. The windings 66, 68, 70, 72 are then connected to the power semiconductor module terminals $G_1$, $G_2$, $SS_1$, $SS_2$ as appropriate through PCB traces.

Figure 6:
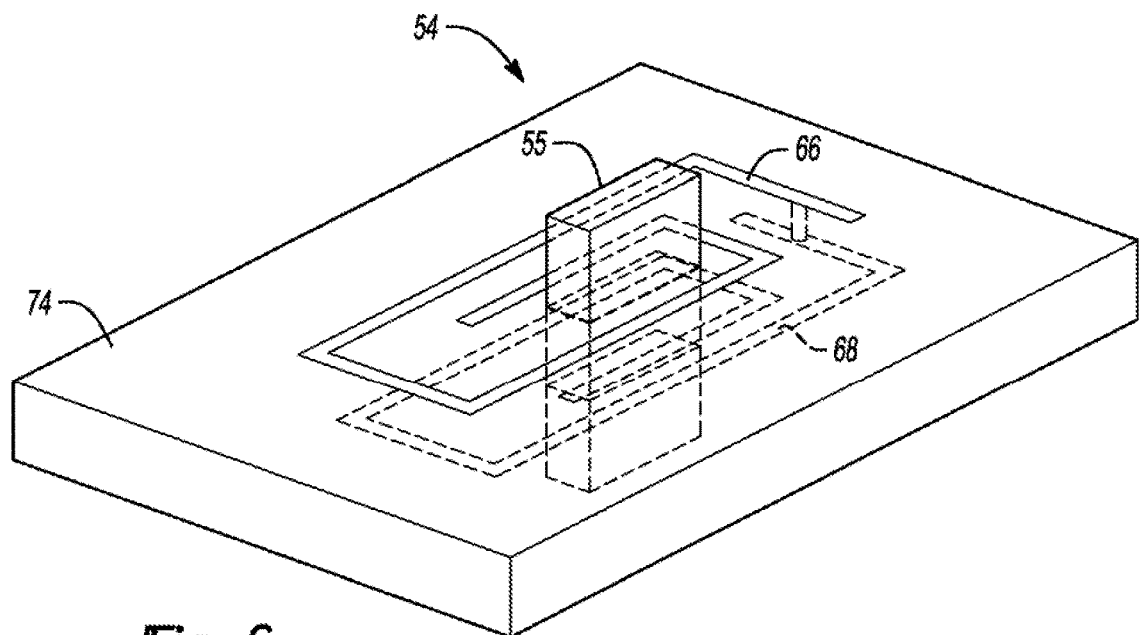
FIG. 6 is a schematic diagram of a DM choke based on PCB windings.
Figure 7:
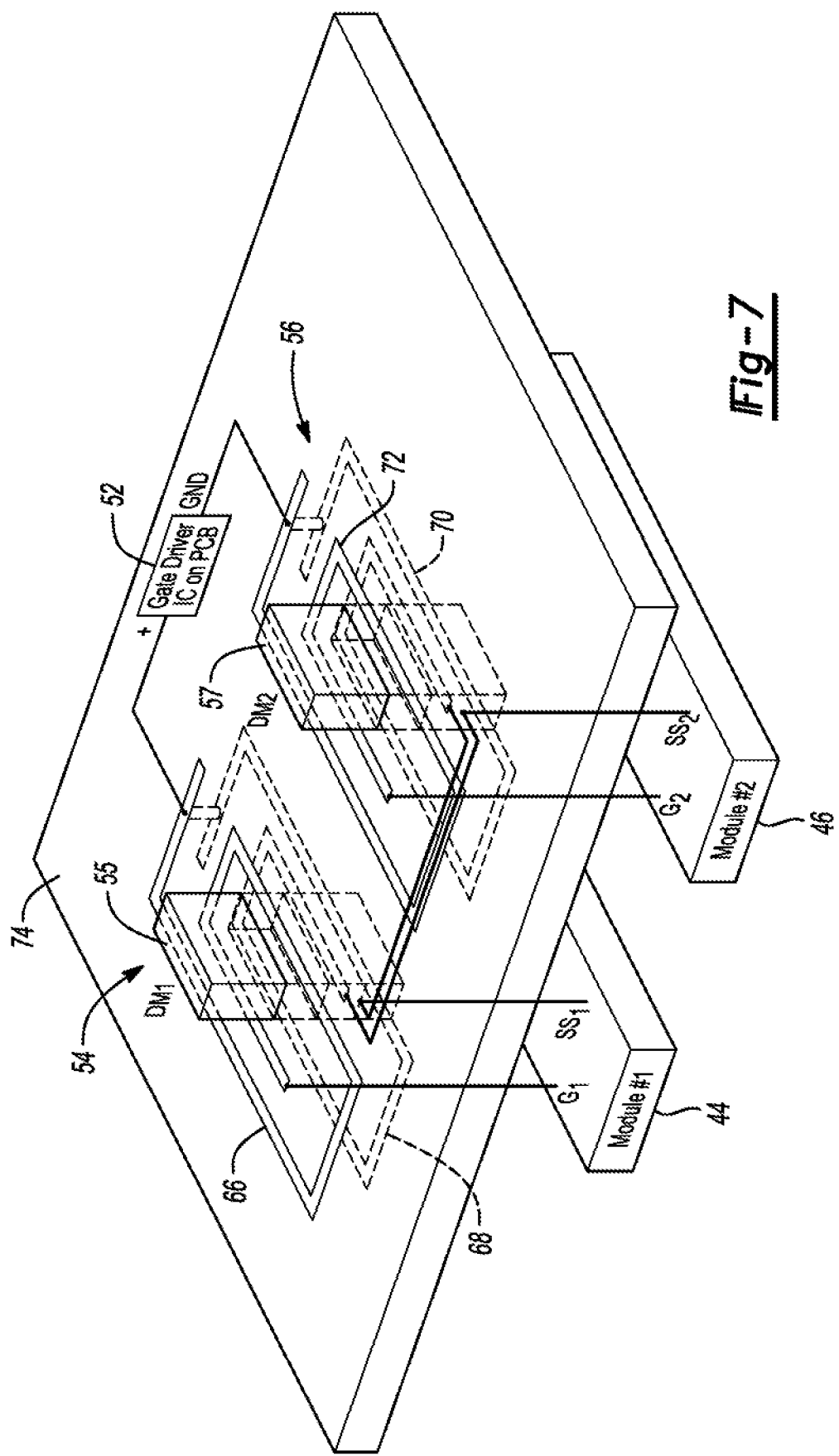
FIG. 7 is a schematic diagram of proposed DM chokes based on printed circuit board (PCB) windings integrated with a gate drive PCB.

The windings 66, 68, 70, 72 can be implemented as PCB traces in different layers. Referring to FIG. 6, the winding 66 is implemented in a layer of the PCB 74 above the winding 68 given the orientation shown. The windings 70,72 may be similarly arranged. The windings 66, 68, 70, 72 can then be connected to the power semiconductor modules 44, 46 as shown in FIG. 7.

Figure 8:
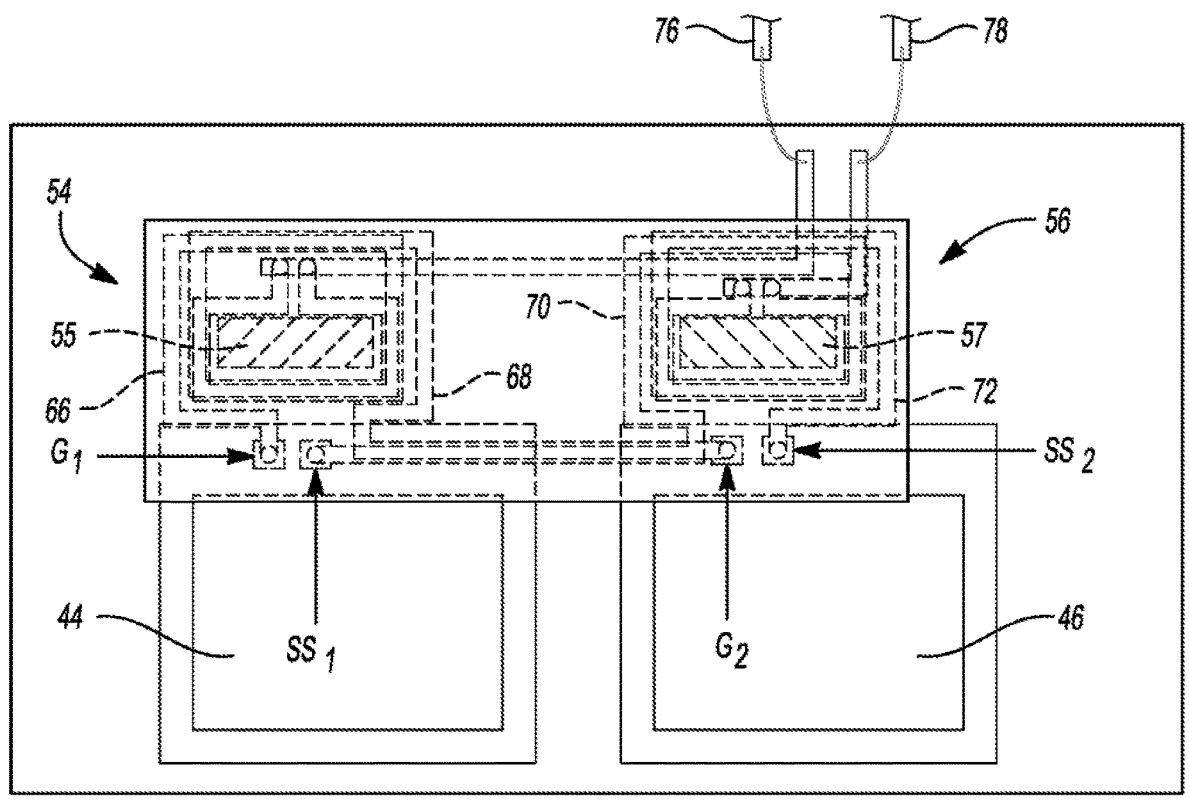
FIG. 8 is a schematic diagram of proposed DM chokes based on PCB windings internal to a power module.

Referring to FIG. 8, the proposed DM chokes 54, 56 with PCB windings can also be integrated inside a power module that packages the paralleled power semiconductors 44, 46. Different ones of the windings 66, 68, 70, 72 can be implemented in different PCB layers. As suggested above, the windings 66, 68, 70, 72 can be connected to power semiconductor control terminals/pads and power module external terminals (pins) 76, 78 by direct soldering or wire bonding.

The described embodiments include DM chokes in parallel operated power semiconductor gate paths and on-chip current sensor source paths. Possible advantages associated with some of these arrangements are summarized as follows. During power semiconductor parallel operation, the proposed chokes can prevent gate breakdown of both the main cells and the current sensor cells. The additional elements needed to implement the DM chokes are passive: A simpler and less expensive option as compared with active elements. The proposed chokes are added in the gate drive loops, which are the low power control loops, so the extra loss generated by the chokes is negligible. The DM chokes can be implemented either inside the power module or on the gate drive PCB (outside the power module), and do not occupy much extra space. Due to the coupling of the windings, the power semiconductor main cells and on-chip current sensor cell gate loop inductances are not increased after adding the proposed choke. So, the power semiconductor switching transient time and switching loss are not increased. The choke winding impedance value (e.g., $L_{DM1}$, $L_{DM2}$) can be tuned to the required value for different power semiconductor paralleling conditions. Proposed methods of adding a choke and its implementations are not limited by the number of power semiconductors in traction inverters. The chokes can be applied to any type of power semiconductor, such as MOSFETs, IGBTs, etc.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. Power electronics circuitry comprising:
   a pair of parallel power semiconductors including gates connected via a gate path and current sensors connected via a sensor path;
   a gate driver tapping the gate and sensor paths;
   a first differential mode choke including a pair of windings defining a portion of the gate path and sharing a positive terminal with the gate driver; and
   a second differential mode choke including a pair of windings defining a portion of the sensor path and sharing a negative terminal with the gate driver.

2. The power electronics circuitry of claim 1, wherein an impedance of the windings of the second differential mode choke is greater than an equivalent impedance of the parallel power semiconductors and junction capacitances of the current sensors.

3. The power electronics circuitry of claim 1, wherein each of the first and second differential mode chokes includes a magnetic core.

4. The power electronic circuitry of claim 3, wherein the windings of each of the first and second differential mode chokes are wound around one of the magnetic cores.

5. The power electronics circuitry of claim 1, further comprising a printed circuit board, wherein the windings of the first and second differential mode chokes are mounted directly on the printed circuit board.

6. The power electronics circuitry of claim 1, further comprising a printed circuit board, wherein the windings of the first and second differential mode chokes are traces in different layers of the printed circuit board.

7. The power electronics circuitry of claim 1, wherein the parallel power semiconductors are metal-oxide-semiconductor field-effect transistors each including a Kelvin source connected via a Kelvin path, and wherein the gate driver further taps the Kelvin path.

8. The power electronics circuitry of claim 1, wherein the parallel power semiconductors are insulated-gate bipolar transistors each including a Kelvin emitter connected via a Kelvin path, and wherein the gate driver further taps the Kelvin path.

9. Power electronics circuitry comprising:
   a pair of parallel power semiconductors each including a gate and a current sensor;
   a first differential mode choke defining a portion of a gate path connecting the gates;
   a second differential mode choke defining a portion of a sensor path connecting the current sensors; and
   a gate driver tapping the gate and current sensor paths.

10. The power electronics circuitry of claim 9, wherein the first differential mode choke includes a pair of windings that share a positive terminal of the gate driver.

11. The power electronics circuitry of claim 10, wherein the first differential mode choke further includes a magnetic core, and wherein the windings are wound around the magnetic core.

12. The power electronics circuitry of claim 11, wherein an impedance of the windings is greater than an equivalent impedance of the parallel power semiconductors and junction capacitances of the current sensors.

13. The power electronics circuitry of claim 9, wherein the second differential mode choke includes a pair of windings that share a negative terminal of the gate driver.

14. The power electronics circuitry of claim 9, wherein each of the first and second differential mode chokes includes a magnetic core.

15. The power electronic circuitry of claim 14, wherein each of the first and second differential mode chokes includes windings wound around one of the magnetic cores.

16. The power electronics circuitry of claim 9 further comprising a printed circuit board, wherein each of the first and second differential mode chokes includes windings mounted directly on the printed circuit board.

17. The power electronics circuitry of claim 9 further comprising a printed circuit board, wherein each of the first and second differential mode chokes includes windings implemented as traces in different layers of the printed circuit board.

18. Power electronics circuitry comprising:
   parallel power semiconductors associated with a printed circuit board, each of the parallel power semiconductors including a gate and a current sensor;
   a first differential mode choke including a first magnetic core and a first pair of traces in different layers of the printed circuit board surrounding the first magnetic core and defining windings of the first differential mode choke, wherein the first differential mode choke is in a gate path connecting the gates;
   a second differential mode choke including a second magnetic core and a second pair of traces in different layers of the printed circuit board surrounding the second magnetic core and defining windings of the second differential mode choke, wherein the second differential mode choke is in a sensor path connecting the current sensors; and a gate driver including a positive terminal tapping the gate path and a negative terminal tapping the sensor path.

19. The power electronics circuitry of claim 18, wherein the windings of the first differential mode choke share a terminal with the positive terminal.

20. The power electronic circuitry of claim 18, wherein the windings of the second differential mode choke share a terminal with the negative terminal.

* * * * *